United States Patent
Courvoisier et al.

(10) Patent No.: US 10,131,017 B2
(45) Date of Patent: Nov. 20, 2018

(54) LASER NANOMACHINING DEVICE AND METHOD

(71) Applicants: François Courvoisier, Cussey sur L'ognon (FR); Pierre-Ambroise Lacourt, Besançon (FR); Maxime Jacquot, Besançon (FR); Luca Furfaro, Auxon Dessus (FR); John Dudley, Besançon (FR); Michel De Labachelerie, Ferrieres-les-Bois (FR)

(72) Inventors: François Courvoisier, Cussey sur L'ognon (FR); Pierre-Ambroise Lacourt, Besançon (FR); Maxime Jacquot, Besançon (FR); Luca Furfaro, Auxon Dessus (FR); John Dudley, Besançon (FR); Michel De Labachelerie, Ferrieres-les-Bois (FR)

(73) Assignees: CENTRE NATIONAL DE LA RECHERCHE SCIENTIFIQUE—CNRS, Paris (FR); UNIVERSITE DE FRANCHE-COMTE, Besancon (FR)

( * ) Notice: Subject to any disclaimer, the term of this patent is extended or adjusted under 35 U.S.C. 154(b) by 921 days.

(21) Appl. No.: 14/394,159

(22) PCT Filed: Apr. 12, 2013

(86) PCT No.: PCT/EP2013/057673
§ 371 (c)(1),
(2) Date: Feb. 9, 2015

(87) PCT Pub. No.: WO2013/153195
PCT Pub. Date: Oct. 17, 2013

(65) Prior Publication Data
US 2015/0158120 A1  Jun. 11, 2015

(30) Foreign Application Priority Data

Apr. 13, 2012 (FR) .................................... 12 53404

(51) Int. Cl.
*B23K 26/00* (2014.01)
*B23K 26/0622* (2014.01)
(Continued)

(52) U.S. Cl.
CPC ........ *B23K 26/0624* (2015.10); *B23K 26/006* (2013.01); *B23K 26/0613* (2013.01);
(Continued)

(58) Field of Classification Search
CPC ................................................. B23K 26/0624
See application file for complete search history.

(56) References Cited

U.S. PATENT DOCUMENTS 5,916,460 A * 6/1999 Imoto .................... B23K 26/12
                                                  219/121.67
6,181,463 B1 * 1/2001 Galvanauskas ........... G02F 1/39
                                                  359/330
(Continued)

FOREIGN PATENT DOCUMENTS

JP    H0876152 A     3/1996
JP    2001212685 A   8/2001
(Continued)

OTHER PUBLICATIONS

Office Action in counterpart Japanese Patent Application No. 2015-504967, dated Jan. 24, 2017 (7 pages).
(Continued)

*Primary Examiner* — Timothy Kennedy
(74) *Attorney, Agent, or Firm* — Osha Liang LLP

(57) ABSTRACT

According to one aspect, the invention relates to a device (1, 2, 3) for laser nanomachining a sample made of a material
(Continued)

having a given transparency band, the device comprising: a focusing module (203, 703) allowing a nondiffracting beam (210, 710) to be generated, along a focusing line generally oriented along the optical axis of the focusing module, from a given incident beam; first means (202, 702) for emitting a first light pulse ($I_1$) of spectral band comprised in the transparency band of said material, able to generate in said material, after focusing by said focusing module, a plasma of free charges along said focusing line via multi-photon absorption, thus forming a "plasma channel"; and second means (202, 702) for emitting at least one second electromagnetic wave ($I_2$) of spectral band comprised in the transparency band of said material, which wave(s) is/are intended to be spatially superposed on said plasma channel in order to heat said material via absorption by the free charges of the plasma.

15 Claims, 7 Drawing Sheets

(51) Int. Cl.
*B23K 26/06* (2014.01)
*H01L 21/324* (2006.01)
*H01L 21/67* (2006.01)
*H05K 3/00* (2006.01)
*B23K 26/382* (2014.01)
*B23K 26/40* (2014.01)
*B23K 101/40* (2006.01)
*B23K 103/00* (2006.01)

(52) U.S. Cl.
CPC ............ *B23K 26/382* (2015.10); *B23K 26/40* (2013.01); *H01L 21/3247* (2013.01); *H01L 21/67115* (2013.01); *H05K 3/0038* (2013.01); *B23K 2201/40* (2013.01); *B23K 2203/50* (2015.10); *B23K 2203/52* (2015.10)

(56) References Cited

U.S. PATENT DOCUMENTS

| | | | |
|---|---|---|---|
| 2003/0168434 A1* | 9/2003 | Gross | B23K 26/0626 219/121.7 |
| 2004/0047587 A1* | 3/2004 | Osborne | B23K 26/0734 385/147 |
| 2005/0006361 A1* | 1/2005 | Kobayashi | B23K 26/0676 219/121.73 |
| 2005/0226287 A1 | 10/2005 | Shah et al. | |
| 2006/0086704 A1* | 4/2006 | Nagai | B23K 26/0057 219/121.72 |
| 2006/0249496 A1* | 11/2006 | Morikazu | B23K 26/0604 219/121.73 |
| 2007/0051706 A1 | 3/2007 | Bovatsek et al. | |
| 2010/0025387 A1* | 2/2010 | Arai | B28D 5/00 219/121.69 |
| 2010/0086741 A1* | 4/2010 | Bovatsek | B23K 26/0617 428/156 |
| 2011/0180729 A1 | 7/2011 | Kafka et al. | |

FOREIGN PATENT DOCUMENTS

| | | | |
|---|---|---|---|
| JP | 2004-136358 A | 5/2004 | |
| JP | 2006305586 A | 11/2006 | |
| JP | 2007196277 A | 8/2007 | |
| JP | 2009031634 A | 2/2009 | |
| WO | 2012006736 A2 | 1/2012 | |
| WO | WO-2012006736 A2 * | 1/2012 | ......... B23K 26/0057 |

OTHER PUBLICATIONS

P. Polynkin et al. (Apr. 10, 2009). Curved Plasma Channel Generation Using Ultraintense Airy Beams. Science, 324, 229-232.
International Search Report for corresponding International Application No. PCT/EP2013/057673, dated Aug. 6, 2013 (2 pages).
Written Opinion for corresponding International Application No. PCT/EP2013/057673, dated Aug. 6, 2013 (12 pages).
Bhuyan M. et al.; "High aspect ratio nanochannel machining using single shot femtosecond Bessel beams," Applied Physics Letters, AIP, American Institute of Physics, Melville, NY, US, vol. 97, No. 8; Aug. 23, 2010 81102-821102; XP012138874 (4 pages).

* cited by examiner

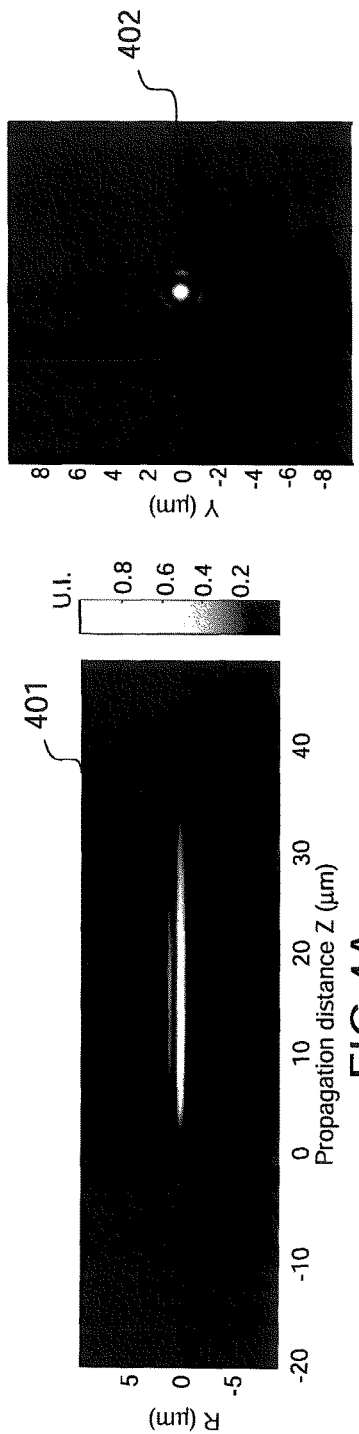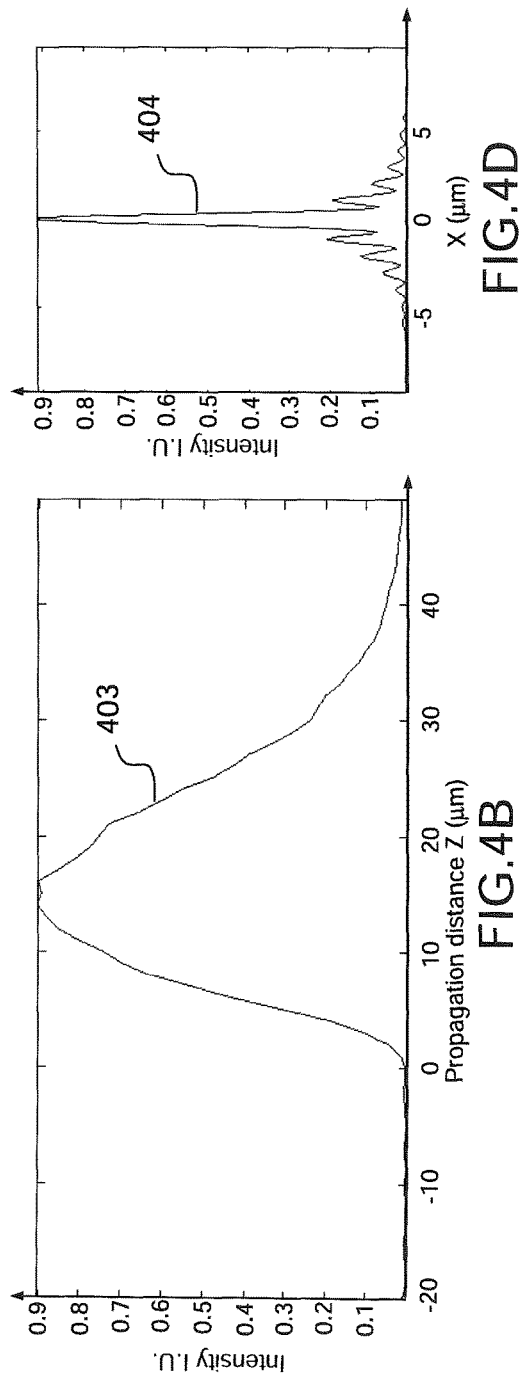

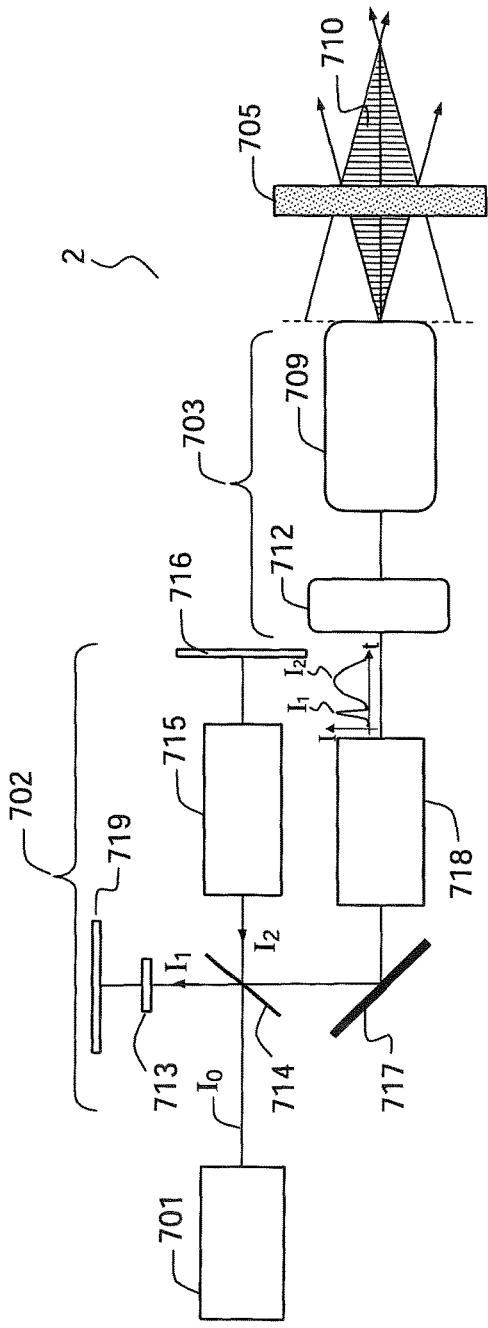
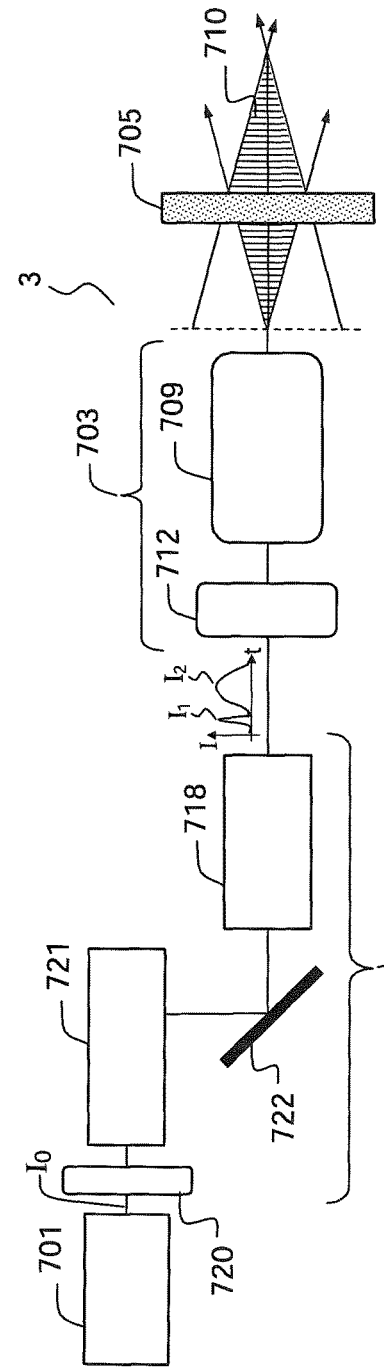
FIG.7A
FIG.7B

LASER NANOMACHINING DEVICE AND METHOD

PRIOR ART

Technical Field of the Invention

The present invention relates to a laser nanomachining method and device, especially suitable for high-aspect-ratio nano-drilling or wafer bonding.

Prior Art

In the context for example of the drilling of channels or "vias" in or through semiconductor wafers for micro- and nano-electronics and photovoltaics, it is sought to obtain deep drill holes, i.e. drill holes having a high aspect ratio, aspect ratio being defined by the ratio of the length of the hole drilled to its diameter. However, independently of the technique used, it is extremely difficult to reach deep hole drilling. Specifically, it is difficult to extract material from and deliver energy to a hole whose diameter is much smaller than its depth. These drilling techniques for example comprise focused ion beam techniques (so-called "e-beam" methods) or photolithography followed by chemical etching (or RIE for "reactive ion etching"). E-beam technology requires a high vacuum, is suitable for holes whose diameter is smaller than 100 nm, has a slow drilling rate and the aspect ratios of the drilled holes obtained are limited to ratios of about 10 to 50. The technology of photolithography requires a mask to be produced beforehand; it is therefore expensive and not very flexible. The aspect ratios of about 10 are obtained.

In the field of high-aspect-ratio micro/nano structuring of dielectric materials (glass), the inventors have demonstrated that the use of a femtosecond laser beam having a "non-diffracting" spatial profile of the Bessel-beam type makes it possible to control the deposition of energy in the depth of the material. This technology especially allows a sufficiently intense and localized micro-explosion to be produced for the material to be ablated to be removed (see for example M. K. Bhuyan et al., "High aspect ratio nanochannel machining using single shot femtosecond Bessel beams", Appl. Phys. Lett. 97, 081102 (2010)). Thus, a single laser pulse allows a very high-aspect-ratio nano-hole (nano-channel) to be produced.

However, this technique cannot be applied to the nano-machining of semiconductors. On the one hand these materials are opaque at the wavelengths (UV, visible and near infrared) of the power lasers conventionally used in machining, and therefore it is impossible for the laser beams to propagate therein. On the other hand, semiconductor materials are highly non-linear and the propagation of non-diffracting beams having the light intensities required for the ablation would lead to an oscillation in intensity along the propagation axis, due to non-linear effects such as the Kerr effect, resulting in nonuniform energy deposition along the propagation axis and insufficient quality of drilling.

Moreover, in dielectric materials such as glass, the Applicants have observed effects that cause destabilization of non-diffracting beams during the ablation of the entrance face, especially due to non-linear differences between the indices of air and the glass, once more resulting in nonuniformity in the deposition of energy along the propagation axis.

One objective of the invention is to provide a nanomachining device and method, especially for high-aspect-ratio drilling, applicable to nanomachining of dielectric materials such as semiconductors.

SUMMARY OF THE INVENTION

According to a first aspect, the invention relates to a device for laser nanomachining a sample made of a material having a given transparency band, the device comprising:
  a focusing module allowing, from a given incident beam, a non-diffracting beam to be generated along a focal line generally oriented along the optical axis of the focusing module;
  first means for emitting a first light pulse in a spectral band comprised in the transparency band of said material, able to generate in said material, after focusing by said focusing module, a plasma of free carriers along said focal line via multi-photon absorption, thus forming a "plasma channel"; and
  second means for emitting at least one second electromagnetic wave in a spectral band comprised in the transparency band of said material, intended to be spatially superposed on said plasma channel in order to heat said material via absorption by the free carriers of the plasma.

The Applicants have demonstrated that such a device makes high-aspect-ratio nano-drilling possible in any type of material having a spectral band of transparency to light waves, including semiconductors. Specifically, by virtue of a temporal shaping of the incident pulses, non-linear effects, and especially the Kerr effects responsible for nonuniformity in the formation of the plasma channel, are limited in the sample.

Thus, the first ultra short light pulse, for example of duration shorter than 10 picoseconds, allows, after focusing in the sample by means of the focusing module, the plasma of free carriers to be formed by multi-photon absorption. The one or more second electromagnetic waves, the light intensity of which is lower than that of the first pulse, allow energy to be deposited via absorption by the free carriers of the plasma.

The non-diffracting beams are advantageously Bessel or Airy beams.

According to one variant, said second electromagnetic wave(s) may be microwaves or terahertz waves, the wavelength of these waves being comprised in the domain of transparency of the material that it is desired to machine in order to prevent any linear absorption.

Alternatively, said second electromagnetic wave(s) are light waves of wavelength also comprised in the domain of transparency of the material.

In the latter case, according to one variant, the second emitting means allow only one second light pulse, for example of duration comprised between a few fractions of a picosecond and a few milliseconds, to be emitted. Alternatively, the second emitting means may allow a train of pulses (e.g. a burst of pulses), for example a train of ultra short pulses that are temporally closely spaced to be emitted.

To form said first light pulse and said second light pulse(s), it is possible to use, according to one variant, two separate synchronized laser sources.

Alternatively, said first and second emitting means are formed by a source emitting a single laser pulse and comprise a temporal shaping module, allowing the first light pulse and the second light pulse(s) to be generated from the light wave emitted by said laser source.

For example, the temporal shaping module comprises a beam splitter allowing at least two channels to be formed, and, in at least one of the channels, a pulse stretcher.

According to another example, the temporal shaping module comprises an acousto-optic programmable dispersive system.

According to one variant, the device according to the first aspect furthermore comprises a frequency converting module downstream of said temporal shaping module. This frequency converting module allows the wavelength of the laser emitting source to be matched to the transparency band of the material to be machined, especially in the case of semiconductors.

Advantageously, the device according to the first aspect furthermore comprises a scanning module allowing the non-diffracting beam and the sample to be moved relative to each other.

According to one variant, the focusing module allows a plurality of non-diffracting beams to be generated in parallel in order to form an array of focal lines in the sample.

According to a second aspect, the invention relates to a method for laser nanomachining a sample made of a material having a given transparency band, the method comprising:

emitting a first pulse in a spectral band comprised in the transparency band of said material;

spatial shaping of said first pulse, allowing, after focusing in said sample, a non-diffracting beam to be formed along a focal line, the light intensity of said non-diffracting beam allowing a plasma of free carriers to be generated along said focal line via multi-photon absorption, thus forming a "plasma channel"; and emitting at least one second electromagnetic wave in a spectral band comprised in the transparency band of said material, spatially superposed on said plasma channel in order to heat said material via absorption by the free carriers of the plasma.

According to one variant, the spatial shaping of said first pulse furthermore comprises spatial modulation of the amplitude of said pulse in order to make the light intensity of said first pulse substantially constant over said focal line.

According to a first example, the method according to the second aspect is applied to nano-drilling of a sample made of a given material in order to form a channel, and furthermore comprises:

controlling the position and the length of the channel to be drilled via the spatial shaping and light intensity of said first light pulse; and controlling the diameter of the channel via the energy deposited by said second electromagnetic wave(s) in the plasma channel thus formed.

According to a second example, the method according to the second aspect is applied to the bonding of a first sample and a second sample, and furthermore comprises:

controlling the position and the length of the heating channel at the interface of the two samples via the spatial shaping and light intensity of said first light pulse; and controlling the melting point on said interface via the energy deposited by said second electromagnetic wave in the plasma channel thus formed.

Advantageously, the method according to the second aspect is used to nanomachine a sample made of a semiconductor, for example in the nano-drilling of channels in semiconductor samples, or to bond two samples at least one of which is made of a semiconductor. The term "semiconductor" is understood in the present description to mean a material the valence band and the conduction band of which are energetically separate (i.e. the material has a bandgap) and the conduction band of which is empty or almost empty at room temperature. For example, it may be a question of a material chosen from silicon, germanium, silicon carbide (SiC), silicon-germanium (SiGe), a material belonging to the gallium/aluminum arsenide family ($Al_xGa_{1-x}As$), the gallium/indium arsenide family ($In_xGa_{1-x}As$), the gallium/indium phosphide family (InGaP), of zinc oxide (ZnO), zinc sulfide (ZnS), zinc telluride (ZnTe), etc.

The method described in the present application is also applicable to dielectric materials, for example glasses, fused silica, quartz, lithium niobate and/or diamond.

BRIEF DESCRIPTION OF THE DRAWINGS

Other advantages and features of the invention will become apparent on reading the description, which is illustrated by the following figures:

FIGS. 4A to 4D, images and spatial profiles of intensity, showing longitudinal (4A, 4B) and transverse (4C, 4D) profiles of example Bessel beams obtained experimentally;

FIGS. 7A and 7B, two embodiments of devices according to the invention;

DETAILED DESCRIPTION

Figure 1:
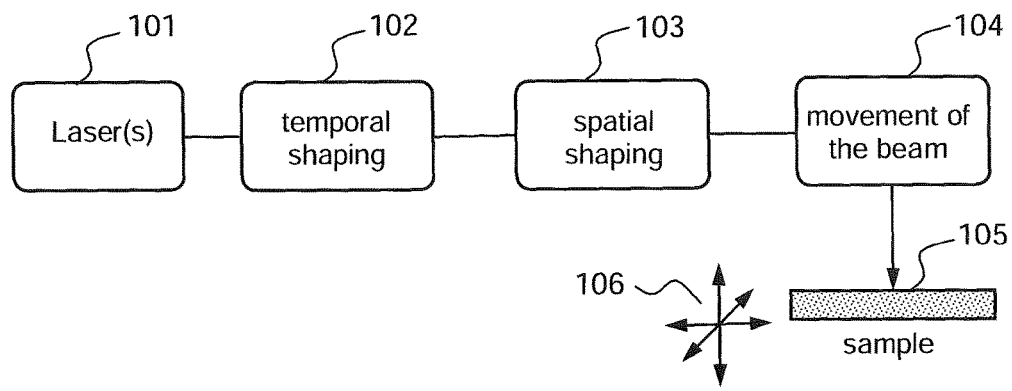
FIG. 1, a diagram illustrating one example of the nanomachining method according to the invention.

FIG. 1 shows a diagram illustrating the nanomachining method according to one embodiment of the invention.

In this example, the nanomachining method comprises the emission 101 of a beam by a pulsed laser source, and focusing of the beam on a sample 105 to be drilled, after a step of temporal shaping 102 and a step of spatial shaping 103, which will be described in greater detail below. Scanning 104 of the beam and translation/rotation (symbolized by the arrows 106) of the sample may allow the beam and the sample to be moved relative to each other in order to produce, sequentially, a plurality of drill holes in a given sample.

In this example, the temporal shaping 102 comprises generating, from a single laser source, a first and a second light pulse in a spectral band comprised in a transparency band of the material from which the sample is formed. The transparency band of the material is the spectral domain in which the absorption coefficient of the medium is lower than a given value, for example 0.5 $cm^{-1}$, corresponding to a transmission, through the medium, of higher than 60% for a medium that is 1 cm in thickness. The spectral transparency band is thus for example the spectral band above 1100 nm for a sample made of semiconductor silicon. In other words, the spectral bands of the first and second pulses are chosen so that electronic transitions can take place only via optical transitions involving at least two photons. The first pulse is short in duration, for example shorter than 10 picoseconds in duration, and preferably about a few fractions of a picosecond in duration. The second pulse, which is longer, even continuous-wave, allows these electrons to be excited and most of the energy enabling the laser ablation to be deposited. The second pulse may be synchronized with the first in order to ensure the excitation produced by the first pulse is still active when the second pulse arrives (typically, this excitation lasts between 0.1 and 5 picoseconds, depending on the material). The second pulse, in the case where its intensity is sufficient, may also amplify the plasma density effect via an avalanche ionization effect. However, the intensity of each of the two pulses must be limited in order not to generate propagation instabilities due to non-linear effects such as the Kerr effect.

Alternatively, two separate laser sources may be used to generate the first and second pulses.

The spatial shaping 103 of the incident beam allows, after focusing, a non-diffracting beam to be formed, this beam forming a focal line in the sample. The non-diffracting beam is for example a Bessel beam or an Airy beam, or more generally any beam having the property of possessing a focal line of given size having a constant profile along its propagation axis—hence the term "non-diffracting". This spatial shaping is applied to the short first pulse, and possibly also to the second pulse as will be described below. If the pulse duration is short (typically shorter than a few fractions of a picosecond) non-linear propagation of the beam may be stabilized at high intensities by increasing focus, i.e. by decreasing the size of the highest intensity light spot in the cross section of the beam. However, if non-linear effects (the Kerr effect in particular) are very strong, stabilization of the beams requires a very high degree of focus (angles typically larger than 20°). It is then no longer technically possible to produce very long and very focused non-diffracting beams, Bessel-type beams for example, because this would require very large diameter lenses that are expensive, bulky and difficult to align.

Temporal shaping of the incident beam into the form of two pulses of appropriate duration and wavelength makes it possible to obtain a low-energy excitation, and thus to minimize non-linear effects during the propagation through the material, and then to deposit the energy density required to heat the material for the ablation or bonding using the longer second pulse. Alternatively, the energy may be deposited by means of an electromagnetic wave that is not a light wave, for example a microwave or a terahertz wave, provided that the spectral band of the electromagnetic wave is comprised in the transparency domain of the material and may be absorbed by the free carriers of the plasma formed by the first pulse. Alternatively, the energy may be deposited by a train of short and closely spaced pulses, as will be detailed below in the description.

Thus, it is possible to produce, in a single step, in samples that may be made of a semiconductor, channels that are both long and narrow using optical means that are of an industrially acceptable size. The first laser pulse will possibly set the length and position of the channel to be drilled, whereas the energy density of the second pulse (or of the pulse train following the first light pulse) will possibly set the diameter of the channel. As regards the field of wafer bonding, the energy density of the second pulse will possibly make it possible to adjust the temperature locally in order to melt the material. The duration and energy parameters of each pulse are determined so as to minimize disadvantageous non-linear effects but also so as to ensure energy is deposited locally in the material. Specifically, excitation with an ultra-short pulse makes it possible to create more free carriers by multi-photon ionization than the ionization induced by defects in the medium, and thus to better control the shape of the plasma channel.

Figure 2:
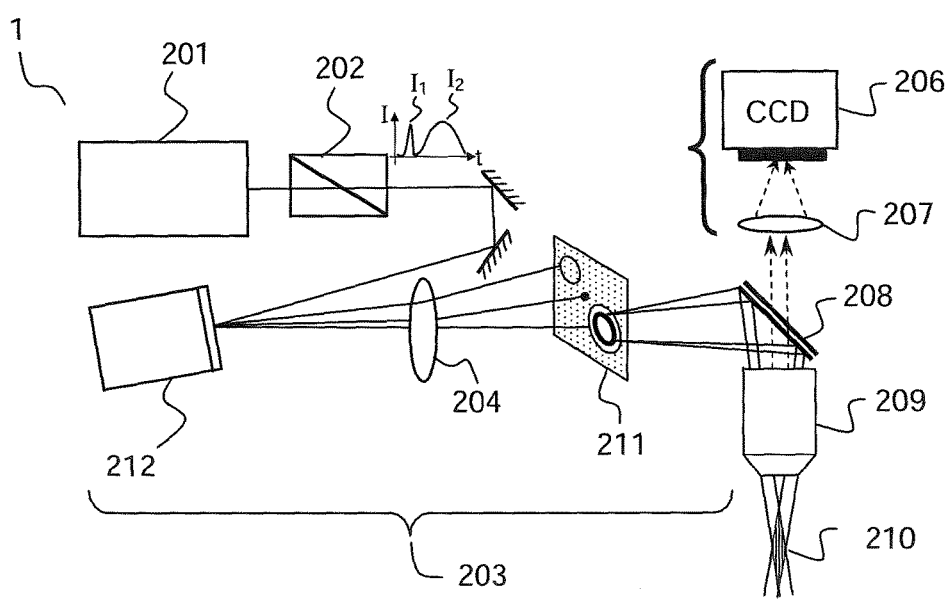
FIG. 2, a diagram showing one example spatial shaping module of a device according to the invention.

FIG. 2 illustrates one embodiment of a nanomachining device 1 according to the invention.

The device 1 comprises a laser source 201 and a temporal shaping module 202 allowing, for example, first and second light pulses, denoted $I_1$ and $I_2$ respectively, to be generated, embodiments of which will be detailed below. The device furthermore comprises a focusing module 203 for shaping the spatial form of the pulses in the sample, allowing, from a given incident beam, a non-diffracting beam 210 to be generated in the sample along a focal line. The non-diffracting beam is for example a Bessel or Airy beam. The focal line is generally oriented along an optical axis of the focusing module. In this example, the two light pulses $I_1$ and $I_2$ pass through the same module 203, thereby making it easier to ensure the spatial superposition of the pulses in the sample. Alternatively, only the first light pulse undergoes spatial shaping in the focusing module 203.

The focusing module 203 allowing a non-diffracting beam to be generated may be a module of the "direct" type, such as that shown in FIG. 2, for example for generating a Bessel beam. In this example it comprises an optical system 212 able to generate a non-diffracting beam, then an imaging system for decreasing the size of the beam in the sample. The optical system 212 may comprise, in order to generate a Bessel beam, in a known way, an axicon lens, an axicon mirror, a matrix of (MEMS) micro-mirrors, a reflection- or transmission-type spatial phase modulator or, generally, any optical system allowing a linear phase modulation to be applied with rotational symmetry. The imaging system is for example a "telescopic" or "4f" type system, in order not to introduce quadratic phase distortion, comprising optics 204 and a microscope objective 209. In the example in FIG. 2, the microscope objective 209 allows the size of the beams in the sample to be greatly decreased. Advantageously, the microscope objective also allows an image of the sample to be machined to be formed on a video camera 206 in front of which a focusing objective 207 is arranged, in order to allow the zone of the sample that it is desired to machine to be pinpointed and to ensure the beam is correctly positioned. In the example in FIG. 2, a spatial filter 211 positioned in the focal plane of the optics 204 allows the diffraction patterns formed by the optical system 212 to be filtered spatially in order to select only spatial frequencies corresponding to the non-diffracting beam of interest, for example the Bessel beam of zeroth order.

Alternatively, for example in the case where an Airy beam is generated, the focusing module 203 is of the "indirect" type, the spatial shaping of the incident beam being achieved in the Fourier plane of a lens (regarding generation of an Airy beam, see for example P. Polynkin et al., "Curved Plasma Channel Generation Using Ultraintense Airy Beams," Science 324, 229-232 (2009)). An imaging system 204, 209, such as that illustrated in FIG. 2, allows the size of the Airy beam to be decreased from the focal image plane of the lens producing the Fourier transform.

Figure 3:
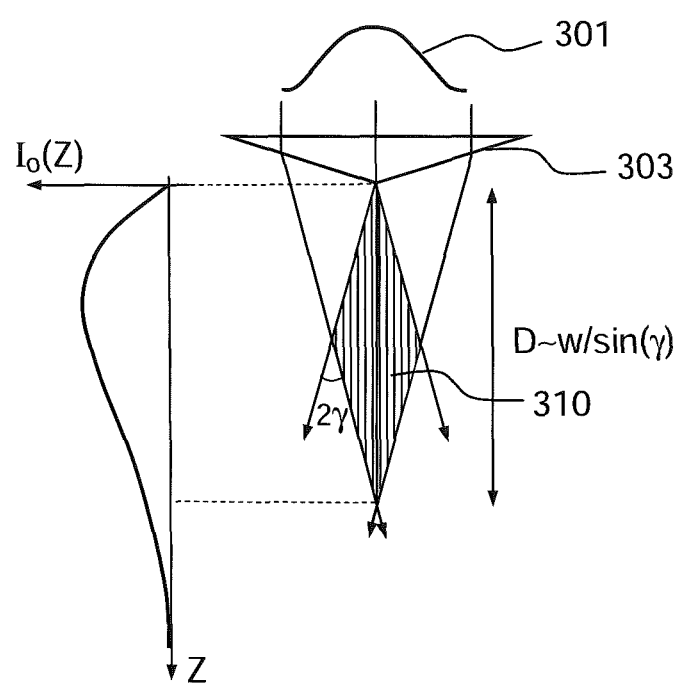
FIG. 3, a diagram illustrating the focusing of a non-diffracting beam of the Bessel-beam type.

FIGS. 3 and 4 illustrate, with diagrams and experimental images or images obtained by simulation, the non-diffracting beam obtained with spatial shaping means suitable for forming a Bessel-type non-diffracting beam.

The focusing/spatial shaping module schematically shown in FIG. 3 is an axicon type optical system 303. In this example, the incident beam 301 has a Gaussian spatial distribution. In a known way, a focal line 310 is formed the light intensity distribution $I_0(z)$ of which follows a Bessel function of zeroth order. The length D of the focal line is proportional to the ratio of the beam width w of the Gaussian beam 301 incident on the optical system 303 to the sine of the conical angle γ defined by the structure of the axicon 303.

FIGS. 4A to 4D show images and spatial profiles of light intensity of the Bessel beam measured in air, for a longitudinal profile (4A, 4B) and a transverse profile (4C, 4D). As may be seen in FIG. 4A (image 401), a propagation with a profile that is constant over a distance of about 20 μm is obtained with a focal spot diameter (image 402, FIG. 4C) smaller than 1 μm. The curve 403 (FIG. 4B) illustrating the spatial profile of the intensity of the image 401 shows the nonuniform distribution of the light intensity along the propagation axis z. This nonuniformity, shown by the intensity curve $I_0(z)$ in FIG. 3, is related to the Gaussian spatial distribution of the incident beam.

According to one variant, the spatial shaping may comprise amplitude modulation allowing the intensity of the beams along the propagation axis to be adjusted, in particular in order to make it as uniform as possible. This amplitude modulation may be achieved either by a specific modulating system of the focusing module, for example a matrix of mirrors or a phase modulator, or it may be integrated into an existing modulating system when such a modulating system is already used to form the non-diffracting beam. In this case, some of the energy may be deviated toward a diffraction order that will be spatially filtered, for example by means of the spatial filter 211 illustrated in FIG. 2.

Figure 5:
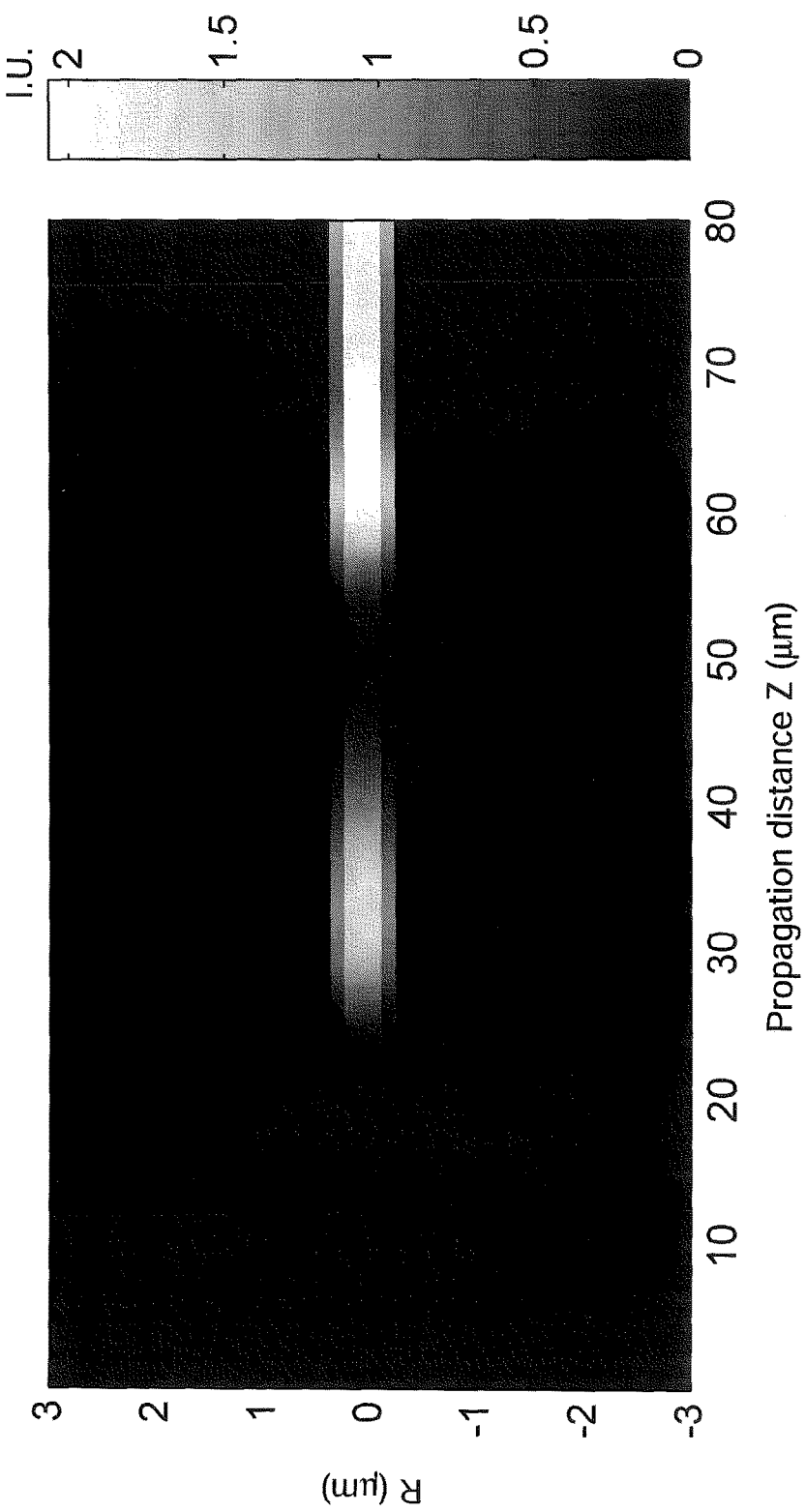
FIG. 5, a simulation showing the map, in the plane, of the plasma density obtained in glass with a prior-art device.
Figure 6:
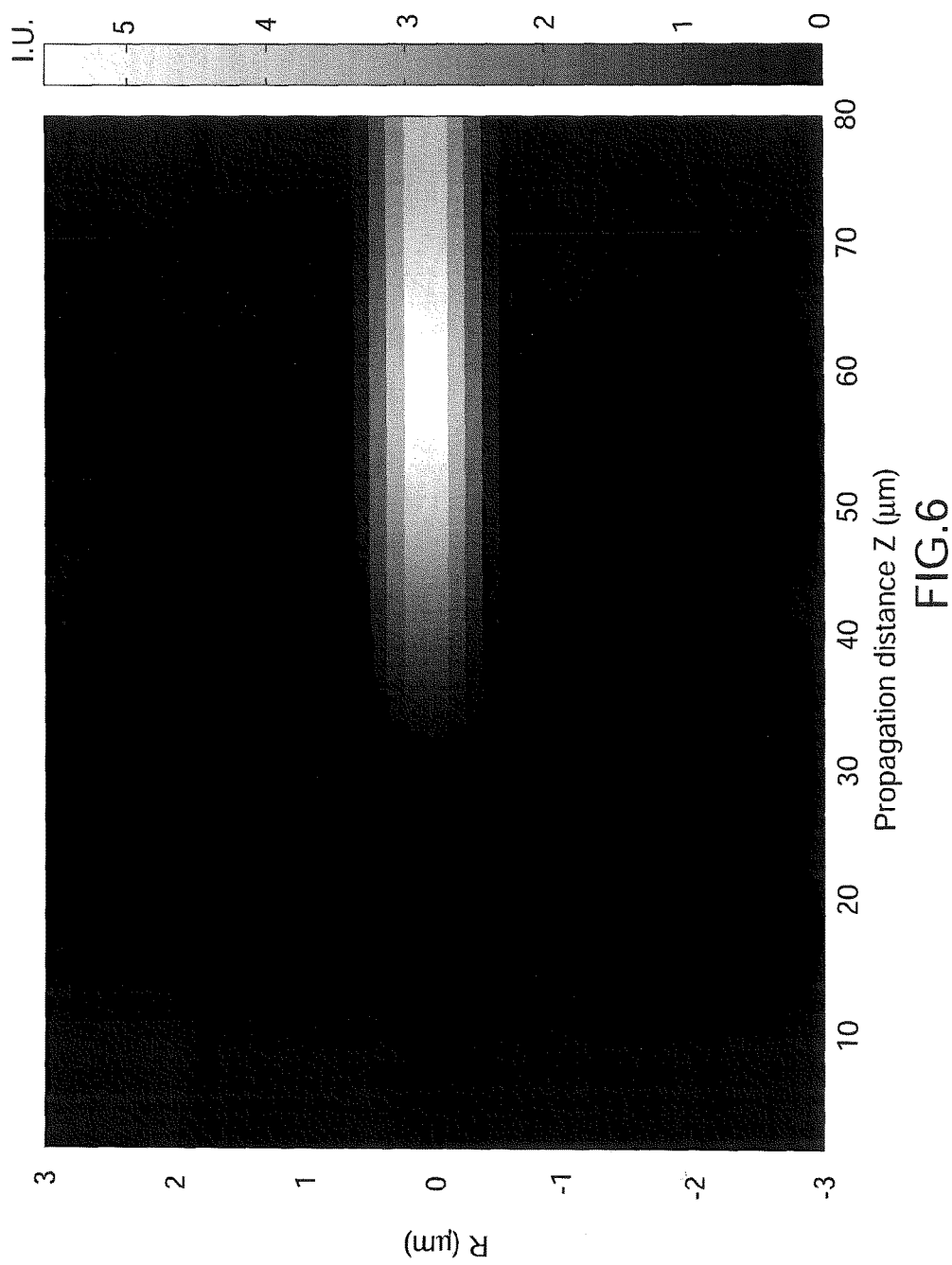
FIG. 6, a simulation showing the map, in the plane, of the plasma density obtained in glass with a device according to one embodiment of the invention.

FIG. 5 shows a numerical simulation corresponding to generation of a plasma by an ultra-short pulse having a Bessel spatial structure, in a narrow-gap (dielectric or semiconductor) medium, in the presence of Kerr nonlinearity. It may be seen in FIG. 5 that for high intensities there is a large variation in the charge density ("plasma channel") created along the propagation axis, this more particularly being the case when the focal line crosses an interface (air/glass for example). Therefore, the energy deposition is particularly nonuniform. FIG. 6 shows the same spatial plasma distribution generated by a sequence of a plurality of pulses, the first ultra-short but low-energy pulse allowing the plasma channel to be generated and the second pulse or the subsequent pulse train allowing energy to be deposited in order to heat the material with a view to ablation or wafer bonding for example. The total light energy is comparable to the preceding case in both instances, but in the case shown in FIG. 6 the plasma distribution exhibits fewer variations and the energy deposition is clearly more uniform.

By virtue of the method described above, channels having diameters of about 10 nanometers to a few microns may be produced with aspect ratios controllable in a range extending from 1 to 500. In the case of wafer bonding, the non-diffracting beams naturally allow constraints on the positioning of the beam with respect to the interface to be greatly decreased since the focal zone of the non-diffracting beams may be very long.

FIGS. 7A and 7B illustrate two examples of a temporal shaping module implemented in examples of nanomachining devices 2 and 3 according to the invention.

Each of the devices 2 and 3 comprises a laser source 701 and a temporal shaping module 702 allowing said first and second light pulses $I_1$ and $I_2$ to be generated. The device furthermore comprises a focusing module 703 for spatial shaping of the beam, allowing, from a given incident beam, a non-diffracting beam 710, for example a Bessel or Airy beam, to be generated in the way described above. For example, the focusing module comprises an optical system 712 able to generate the non-diffracting beam, an optical block 709 comprising a telescope for decreasing beam size and a set of mirrors allowing the beam to be deflected and scanned. In the examples in FIGS. 7A and 7B, a frequency converting module 718 allows the wavelength of the pulses to be matched to the transparency band of the material to be machined. In the case of silicon for example, a wavelength of 1550 nm will preferably be chosen. An ultra-short beam at this wavelength may for example be obtained by virtue of a laser 701, possibly a fiber laser, centered on 800 nm (for example in titanium:sapphire technology) or 1030 nm to 1064 nm (for example in ytterbium technology), that is injected into the frequency converting system 718, the latter possibly being an optical parametric amplifier (OPA) or an optical parametric oscillator (OPO). The frequency converting module may be arranged downstream of the temporal shaping module 702, the temporal shaping possibly being easier to carry out at shorter wavelengths.

FIG. 7A illustrates a first example temporal shaping module 702. In this example, a pulse $I_0$ emitted by the laser source 701 is split into two by means of a beam splitter 714. A first pulse $I_1$ is reflected by a mirror 719 then transmitted to the frequency converting module 718 by means of a deflecting plate 717. An attenuator 713 allows the light intensity of the pulse $I_1$ to be adjusted depending on the nature of the sample 705 that it is desired to machine. A second pulse is temporally stretched by means 715 known in the art of femtosecond technologies, for example a system of gratings, of prisms or an acousto-optic crystal, in order to form the pulse $I_2$. This pulse is then directed toward the frequency converting module 718 in the same way.

FIG. 7B illustrates a second example temporal shaping module 702. In this example, the pulse $I_0$ is split into two pulses and temporally stretched by virtue of an acousto-optic programmable dispersive system 721. An electronically controlled shutter 720 allows one pulse to be selected from a pulse train, for example when a high repetition rate laser source is being employed.

Alternatively to the devices 2 and 3 shown in FIGS. 7A and 7B, two separate synchronized laser sources may be used. The first laser source may then allow, as described above, a first ultra-short pulse to be emitted. The second laser source may allow a second pulse to be emitted the duration of which is for example chosen, depending on the diameter of the channels to be drilled, to be between 1 picosecond and a few milliseconds. The two pulses have spectral bands comprised in the transparency band of the material to be machined. In this case, it is not necessary to use a means to stretch the beam temporally.

According to one variant, the duration and energy of the second pulse are adjusted so that the second pulse has no effect if it is applied alone to the material. In this case, the synchronization of the pulses is a more flexible parameter. The second pulse may be transmitted before the first pulse. The energy deposited in the material is then proportional to the time difference between the end of the second pulse and the start of the first pulse. In particular, this approach allows constraints on the precision of the synchronization to be decreased when the second pulse is long relative to the first pulse.

According to one variant, the nanomachining device according to the invention comprises an electronically controlled shutter allowing one or more pulses to be selected from the pulse train emitted by the laser(s). The shutter may be mechanical or optical. In the latter case, it may for example be a question of a Pockels cell followed by a polarizer.

Alternatively, the temporal shaping comprises generating a pulse train, the ultra-short first of these pulses allowing, by virtue of the focusing module, the plasma of free carriers to be generated in the sample, along the focal line, by multi-photon absorption, and the subsequent pulses allowing energy to be deposited. The first pulse is for example shorter than 10 ps in duration. The second pulses may be longer or shorter but each has a low intensity. Thus, it is possible to use a train of second ultra-short pulses to deposit energy and heat the material via absorption by the free carriers of the plasma, the pulses typically being shorter than 10 ps in duration, for example shorter in duration than the lifetime of the plasma of free carriers in the material (namely about 100 fs in glass). The pulses are temporally closely spaced, for example the temporal gap between the pulses is smaller than 10 ps. The intensity of said pulses is sufficiently low to prevent the beam being destabilized by non-linear effects such as the Kerr effect. In contrast, the intensity of the pulses may be sufficient to contribute to the generation of free carriers and amplify the plasma density. A pulse train may be generated by the means described with reference to FIGS. 7A and 7B, especially with an acousto-optic programmable dispersive system or a plurality of delay lines. Alternatively, it is also possible to spectrally imprint, for example by means of an acousto-optic programmable dispersive system, a phase of the third order, which temporally provides an Airy beam containing multiple peaks.

Figures 8A, 8B, 8C, 8D:
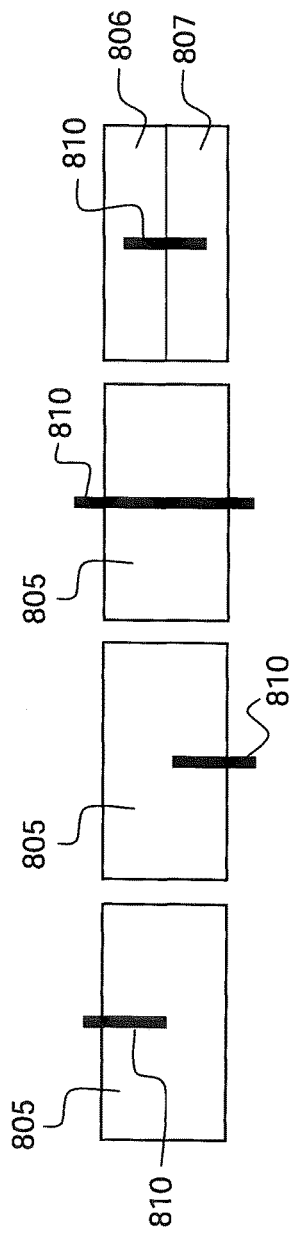
FIGS. 8A to 8D, examples of the implementation of the nanomachining method according to the invention applied to the drilling of through- or blind drill holes and to wafer bonding.

FIGS. 8A to 8D illustrate various applications of the nanomachining method according to the invention. In these figures, the plasma channel is shown by the segment 810. FIGS. 8A and 8B show frontside and backside ablation, respectively, of a sample 805 made of a semiconductor. FIG. 8C shows a through-ablation and FIG. 8D shows bonding of two samples 806 and 807.

According to one variant, in order to sequentially drill a plurality of channels in a sample, it is possible to move the beam and the sample relative to each other. This may be achieved either by moving the beam alone via a beam scanning technique or by moving the sample, via translational and rotational stages, along the various axes of space, or both conjointly. For a bonding application, it is possible to synchronize, electronically or via a computer, the relative movement and the shutter. The relative movement between the beam and the sample especially allows the zone of the ablation or bonding (810, FIGS. 8A to 8D) to be set. For ablation, the beam is positioned such that it crosses a (front or back) surface in order to remove the material. The depth of the beam in the material sets the longitudinal position of the ablation zone.

According to one variant, in order to carry out parallel machining operations, it is also possible to generate a plurality of beans in parallel, for example using matrices of optical systems to form the non-diffracting beams, or using a spatial phase modulator or a hologram allowing a plurality of non-diffracting beams to be produced in parallel.

Figure 9B:
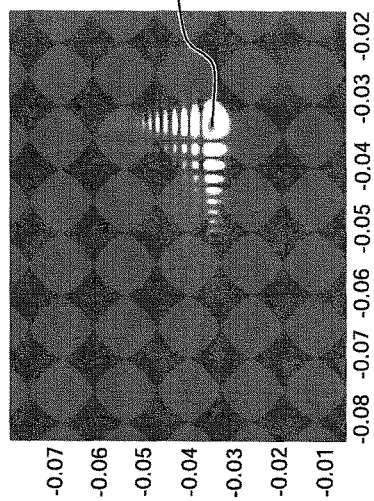
FIG. 9A, a diagram showing the nanomachining method being applied with an Airy beam, and FIG. 9B, an image showing the intensity distribution of an Airy beam.
Figure 9A:
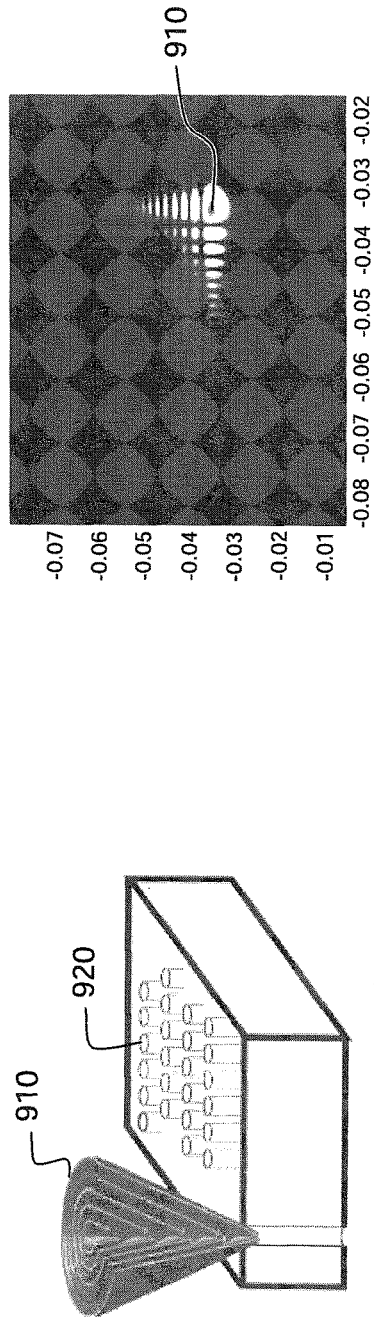

FIGS. 9A and 9B illustrate one variant of the method according to the invention, in which Airy-type non-diffracting beams are generated by the focusing module. During the sequential drilling of nano-channels by a Bessel beam, in the case where the channels are sufficiently close to one another, it is possible for the laser light to have to pass through the zone in which channels have already been drilled beforehand before reaching the ablation line. In this case, a portion of the light is scattered and the beam may be partially deformed. The advantage in this case of using an Airy beam 910, such as that illustrated in FIG. 9B, resides in the fact that the intensity of the laser is contained only in a single quadrant of the plane. Thus, it is possible to drill the channels (920, FIG. 9A) with the main lobe of the Airy beam by arranging for the segment occupied by the light never to be superposed on the zone in which channels have been drilled beforehand.

Although described by way of a number of detailed embodiments, the laser nanomachining method and device according to the invention comprise different variants, modifications and improvements that will appear obvious to those skilled in the art, it being understood that these different variants, modifications and improvements form part of the scope of the invention such as defined by the following claims.

The invention claimed is:

1. A device for laser nanomachining a sample made of a material having a given transparency band, the device comprising:
    a focusing module allowing, from a given incident beam, a non-diffracting beam to be generated along a focal line generally oriented along the optical axis of the focusing module;
    first emitter that emits a first light pulse in a spectral band comprised in the transparency band of said material, able to generate in said material, after focusing by said focusing module, a plasma of free carriers along said focal line via multi-photon absorption, thus forming a plasma channel; and
    second emitter that emits at least one second electromagnetic wave in a spectral band comprised in the transparency band of said material, intended to be collinear with said plasma channel in order to heat said material via absorption by the free carriers of the plasma.

2. The device as claimed in claim 1, wherein said first light pulse has a duration shorter than 10 picoseconds.

3. The device as claimed in claim 1, wherein said second emitter allows a train of light pulses to be emitted.

4. The device as claimed in claim 1, wherein said first and second emitters are formed by two separate synchronized laser sources.

5. The device as claimed in claim 1, wherein said first and second emitters are formed by a source emitting a single laser pulse and a temporal shaping module, allowing a first and at least one second light pulses to be generated from the light wave emitted by said laser source.

6. The device as claimed in claim 5, wherein said temporal shaping module comprises a beam splitter allowing at least two channels to be formed, and, in at least one of the channels, a pulse stretcher.

7. The device as claimed in claim 5, wherein said temporal shaping module comprises an acousto-optic programmable dispersive system.

8. The device as claimed in claim 5, further comprising a frequency converting module downstream of said temporal shaping module.

9. The device as claimed in claim 1, wherein the focusing module allows a Bessel beam to be generated.

10. The device as claimed in claim 1, wherein the focusing module allows an Airy beam to be generated.

11. The device as claimed in claim 1, wherein said focusing module allows a matrix of non-diffracting beams to be formed.

12. A method for laser nanomachining a sample made of a material having a given transparency band, the method comprising:

emitting a first pulse in a spectral band comprised in the transparency band of said material;

spatial shaping of said first pulse, allowing, after focusing in said sample, a non-diffracting beam to be formed along a focal line, the light intensity of said non-diffracting beam allowing a plasma of free carriers to be generated along said focal line via multi-photon absorption, thus forming a plasma channel; and emitting at least one second electromagnetic wave in a spectral band comprised in the transparency band of said material, collinear with said plasma channel in order to heat said material via absorption by the free carriers of the plasma.

13. The method as claimed in claim 12, wherein the spatial shaping of said first pulse furthermore comprises spatial modulation of the amplitude of said pulse in order to make the light intensity of said first pulse substantially constant over said focal line.

14. The method as claimed in claim 12, applied to nano-drilling of a sample made of a given material in order to form a channel, comprising:

controlling the position and the length of the channel to be drilled via the spatial shaping and light intensity of said first light pulse; and controlling the diameter of the channel via the energy deposited by said second electromagnetic wave(s) in the plasma channel thus formed.

15. The method as claimed in claim 12, wherein the sample is made of a semiconductor.

* * * * *